(12) United States Patent
Han et al.

(10) Patent No.: US 8,735,870 B2
(45) Date of Patent: May 27, 2014

(54) ORGANIC THIN FILM TRANSISTOR AND METHOD FOR MANUFACTURING THE SAME

(75) Inventors: Chang Wook Han, Anyang-si (KR); Jae Yoon Lee, Seoul (KR)

(73) Assignee: LG Display Co., Ltd., Seoul (KR)

( * ) Notice: Subject to any disclaimer, the term of this patent is extended or adjusted under 35 U.S.C. 154(b) by 768 days.

(21) Appl. No.: 11/644,243

(22) Filed: Dec. 22, 2006

(65) Prior Publication Data

US 2007/0152210 A1   Jul. 5, 2007

(30) Foreign Application Priority Data

Dec. 29, 2005 (KR) .................. 10-2005-0134406
Dec. 29, 2005 (KR) .................. 10-2005-0134410

(51) Int. Cl.
  *H01L 29/08* (2006.01)
(52) U.S. Cl.
  USPC .................. 257/40; 257/E51.005; 438/99
(58) Field of Classification Search
  USPC .............. 257/40, E51.001–E51.052; 438/99
  See application file for complete search history.

(56) References Cited

U.S. PATENT DOCUMENTS

| | | | |
|---|---|---|---|
| 6,723,394 B1 * | 4/2004 | Sirringhaus et al. | 428/1.1 |
| 7,019,328 B2 * | 3/2006 | Chabinyc et al. | 257/40 |
| 2003/0068581 A1 | 4/2003 | Kawamura et al. | |
| 2004/0238816 A1 * | 12/2004 | Tano et al. | 257/40 |
| 2005/0176185 A1 * | 8/2005 | Jang et al. | 438/155 |
| 2005/0202348 A1 | 9/2005 | Nakayama et al. | |
| 2006/0157692 A1 * | 7/2006 | Wada et al. | 257/40 |
| 2006/0160277 A1 * | 7/2006 | Sirringhaus et al. | 438/149 |
| 2006/0216853 A1 * | 9/2006 | Nomoto | 438/99 |
| 2006/0267003 A1 * | 11/2006 | Suh et al. | 257/40 |

FOREIGN PATENT DOCUMENTS

| | | |
|---|---|---|
| EP | 1282175 | 2/2003 |
| EP | 1434282 A2 | 6/2004 |
| JP | 11-145478 | 5/1999 |
| JP | 2002-148597 A2 | 5/2002 |
| JP | 2003-338629 | 11/2003 |
| JP | 2004-031801 | 1/2004 |
| JP | 2005-166315 | 5/2005 |

(Continued)

OTHER PUBLICATIONS

Chua, L.-L., et al. "High-Stability Eultrathin Spin-On Benzocyclobutene Gate Dielectric for Polymer Field-Effect Transistors." Appl. Phys. Lett., vol. 84, No. 17 (Apr. 26, 2004): pp. 3400-3402.*

(Continued)

*Primary Examiner* — Matthew Landau
*Assistant Examiner* — Mark Tornow
(74) *Attorney, Agent, or Firm* — Brinks Gilson & Lione

(57) ABSTRACT

An organic thin film transistor and a method for manufacturing the same is disclosed, which can improve the device properties by decreasing a contact resistance which occurs in a contact area between an organic semiconductor layer and source/drain electrodes. The organic thin film transistor includes a gate electrode formed on a substrate, a gate insulation layer formed on the gate electrode, source and drain electrodes overlapped with both edges of the gate electrode and formed on the gate insulation layer, an organic semiconductor layer formed on the gate insulation layer including the source/drain electrodes, a first adhesive layer having hydrophilic properties formed between the gate insulation layer and the source/drain electrodes, and a second adhesive layer having hydrophobic properties formed between the organic semiconductor layer and the gate insulation layer.

4 Claims, 14 Drawing Sheets

(56) References Cited

FOREIGN PATENT DOCUMENTS

| JP | 2005-150640 | 6/2005 |
|---|---|---|
| JP | 2005-251809 | 9/2005 |
| JP | 2005-277204 | 10/2005 |
| JP | 2005-310962 | 11/2005 |
| WO | WO 01/47043 | 6/2001 |
| WO | WO 03/15255 A1 | 2/2003 |
| WO | 03/052841 A1 | 6/2003 |
| WO | WO 2004/051228 A1 | 6/2004 |
| WO | WO 2004/055920 | 7/2004 |
| WO | WO 2004/066477 | 8/2004 |
| WO | WO 2004066477 A2 * | 8/2004 |
| WO | WO 2006/049288 | 5/2006 |

OTHER PUBLICATIONS

Ando, M. et al. "Self-Aligned Self-Assembly Process for Fabricating Organic Thin-Film Transistors." Appl. Phys. Lett., vol. 85, No. 10 (Sep. 6, 2004): pp. 1849-1851.*

Combined Search and Examination Report dated Mar. 19, 2007 for corresponding Great Britain Application No. GB0623486.8.

Office Action issued in corresponding Chinese Patent Application No. 2006101452571; issued Dec. 19, 2008.

Parashkov, Radoslav et al. :Large Area Electronics Using Printing Methods Proceedings of the IEEE, vol. 93. Jul. 7, 2005:1321-1329.

Ignagaki, N. et al. "Durable and Hydrophobic Surface Modification by Plasma Polymers Deposited from Acetylene/Hexafluoracetone Ethylene/Hexafluroacetone, and Ethane/Hexafluoroaetone Mixtures" Journal of Applied Polymer Science vol. 41. 1990:995-973.

Office Action issued in corresponding German Patent Application No. 10 2006 055 067.6; issued Apr. 28, 2010.

Search Report issued in corresponding French Patent Application No. 0610453, mailed Nov. 5, 2010.

Office Action issued in corresponding Japanese Patent Application No. 2006-351666, mailed Jan. 18, 2012.

Office Action issued in corresponding Japanese Patent Application No. 2006-351666, mailed Sep. 13, 2012.

* cited by examiner

ORGANIC THIN FILM TRANSISTOR AND METHOD FOR MANUFACTURING THE SAME

This application claims the benefit of priority of Korean Patent Application Nos. P2005-134406 and P2005-134410, both filed on Dec. 29, 2005, the contents of both of which are hereby incorporated by reference as if fully set forth herein.

BACKGROUND

1. Technical Field

The present invention relates to a thin film transistor and a method for manufacturing the same, and more particularly, to an organic thin film transistor and a method for manufacturing the same.

2. Discussion of the Related Art

Generally, a thin film transistor is used as a switching element for a display device. The thin film transistor may be formed of various materials, for example, silicon and organic materials. The organic thin film transistor is formed of an organic semiconductor material. Also, the organic thin film transistor uses a flexible substrate instead of a glass substrate. Except that the organic thin film transistor uses the organic semiconductor material and the flexible substrate, the organic thin film transistor is similar in structure to the silicon thin film transistor.

FIG. 1 is a cross section view illustrating a related art organic thin film transistor. As shown in FIG. 1, the related art organic thin film transistor includes a gate electrode 52a of a metal material formed on a lower substrate 51; a gate insulation layer 53 formed on the lower substrate 51 including the gate electrode 52a; source and drain electrodes 55a and 55b overlapped with both edges of the gate electrode 52a and formed on the gate insulation layer 53; and an organic semiconductor layer 54 formed on the gate insulation layer 53 including the source and drain electrodes 55a and 55b. In this case, the source and drain electrodes 55a and 55b may comprise an inorganic metal material of palladium (Pd) or silver (Ag).

For the above-mentioned organic thin film transistor, the gate insulation layer 53 may comprise an organic material. The gate insulation layer 53 of the organic material is treated with plasma to improve an adhesive strength between the gate insulation layer 53 of the organic material and the source/drain electrodes 55a/55b of the metal material.

However, the gate insulation layer treated with plasma has hydrophilic properties. If the organic semiconductor layer is formed on the gate insulation layer with hydrophilic properties, the organic semiconductor layer grows with small grains.

FIG. 2A shows the grain structure of the organic semiconductor layer formed on the gate insulation layer having hydrophobic properties which is not treated with plasma. FIG. 2B shows the grain structure of the organic semiconductor layer formed on the gate insulation layer having hydrophilic properties which is treated with plasma. As comparing FIG. 2A with FIG. 2B, the grain size of the organic semiconductor layer formed on the gate insulation layer having hydrophilic properties is smaller than the grain size of the organic semiconductor layer formed on the gate insulation layer having hydrophobic properties.

If the organic semiconductor layer having small grain size is formed on the gate insulation layer having hydrophilic properties, a grain boundary increases in number due to the small grain size. Since the grain boundary functions as a charge trap site, the electric properties of the organic semiconductor layer deteriorate.

BRIEF SUMMARY

Accordingly, the present invention is directed to an organic thin film transistor and a method for manufacturing the same, which substantially obviates one or more problems due to limitations and disadvantages of the related art.

An organic thin film transistor comprises a gate electrode formed overlying a substrate, a gate insulation layer formed overlying the gate electrode, source and drain electrodes overlapped with both edges of the gate electrode and formed overlying the gate insulation layer, an organic semiconductor layer formed overlying the gate insulation layer including the source/drain electrodes, a first adhesive layer having hydrophilic properties formed between the gate insulation layer and the source/drain electrodes, and a second adhesive layer having hydrophobic properties formed between the organic semiconductor layer and the gate insulation layer.

An organic thin film transistor is disclosed, that comprises a buffer layer formed overlying a substrate, island-shaped source and drain electrodes formed overlying the buffer layer, an organic semiconductor layer formed overlying the source and drain electrodes, a gate insulation layer formed overlying the substrate including the organic semiconductor layer, a gate electrode overlapped with the source and drain electrodes, and formed overlying the gate insulation layer, a first adhesive layer having hydrophilic properties formed between the buffer layer and the source/drain electrodes, and a second adhesive layer having hydrophobic properties formed between the buffer layer and the organic semiconductor layer.

A method for manufacturing an organic thin film transistor comprises forming a gate electrode overlying a substrate, forming a gate insulation layer overlying an entire surface of the substrate including the gate electrode, performing a first plasma treatment on the gate insulation layer, to form a first adhesive layer of the hydrophilic properties, forming source and drain electrodes on the first adhesive layer, performing a second plasma treatment on the first adhesive layer between the source and drain electrodes, to form a second adhesive layer of the hydrophobic properties, and forming an organic semiconductor layer overlying the gate insulation layer including the second adhesive layer.

A method for manufacturing an organic thin film transistor is also disclosed, comprising forming a buffer layer overlying a substrate, forming a first adhesive layer having hydrophilic properties by performing a first plasma treatment on the buffer layer, forming source and drain electrodes overlying the first adhesive layer, forming a second adhesive layer having hydrophobic properties by performing a second plasma treatment on the first adhesive layer between the source and drain electrodes, sequentially forming an organic semiconductor layer and a gate insulation layer overlying the buffer layer including the second adhesive layer, and forming a gate electrode on the gate insulation layer.

A method for manufacturing an organic thin film transistor comprises forming a gate electrode overlying a substrate, forming a gate insulation layer overlying an entire surface of the substrate including the gate electrode, forming a first adhesive layer having hydrophilic properties by performing a first plasma treatment on the gate insulation layer, forming a second adhesive layer having hydrophobic properties by contacting a mold to a predetermined portion of the first adhesive layer, forming source and drain electrodes overlying the first adhesive layer, and forming an organic semiconductor layer overlying the gate insulation layer including the source and drain electrodes and the second adhesive layer.

A method for manufacturing an organic thin film transistor comprises forming a buffer layer overlying a substrate, forming a first adhesive layer having hydrophilic properties by performing a first plasma treatment on the buffer layer, forming a second adhesive layer having hydrophobic properties by contacting a mold to a predetermined portion of the first adhesive layer, forming source and drain electrodes overlying the first adhesive layer, forming an organic semiconductor layer overlying the buffer layer including the source and drain electrodes and the second adhesive layer, and forming a gate insulation layer and a gate electrode overlying the organic semiconductor layer.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings.

DETAILED DESCRIPTION

FIGS. 3A to 3D are cross section views illustrating a method for manufacturing an organic thin film transistor. FIG. 4A is a cross section view illustrating an LCD device using an organic thin film transistor.

Figure 1:
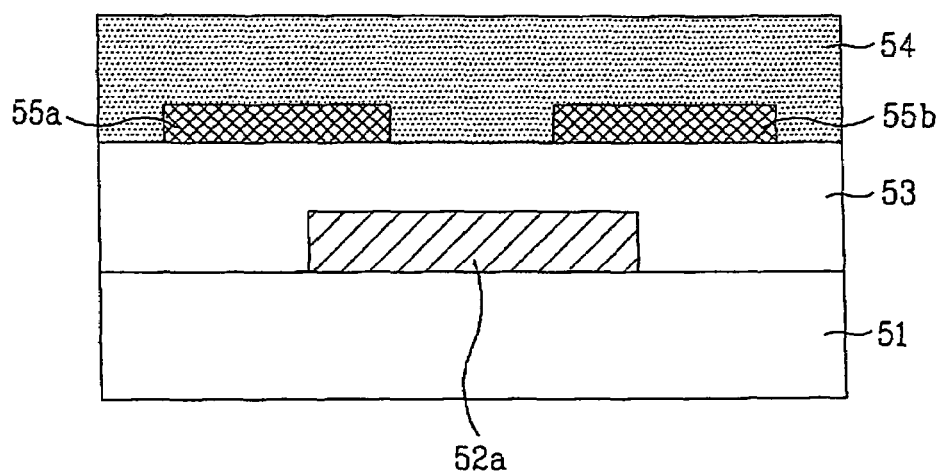
FIG. 1 is a cross section view illustrating a related art organic thin film transistor.
Figure 2A:
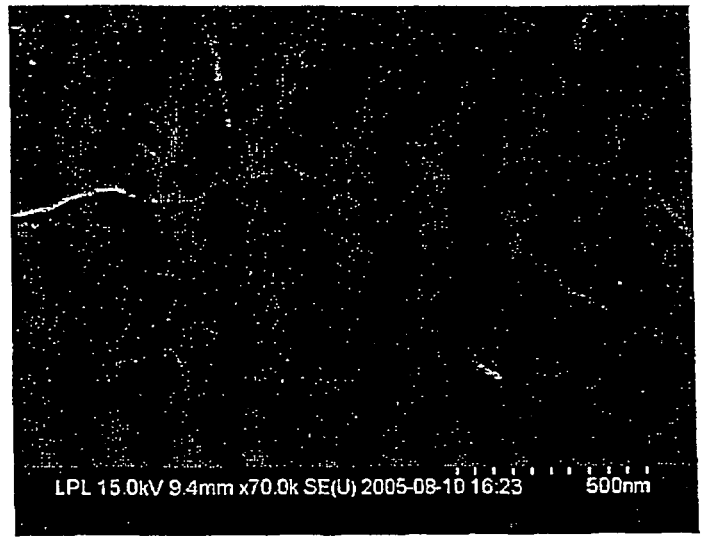
FIGS. 2A and 2B are photographs showing a crystal structure of a related art organic semiconductor layer.
Figure 2B:
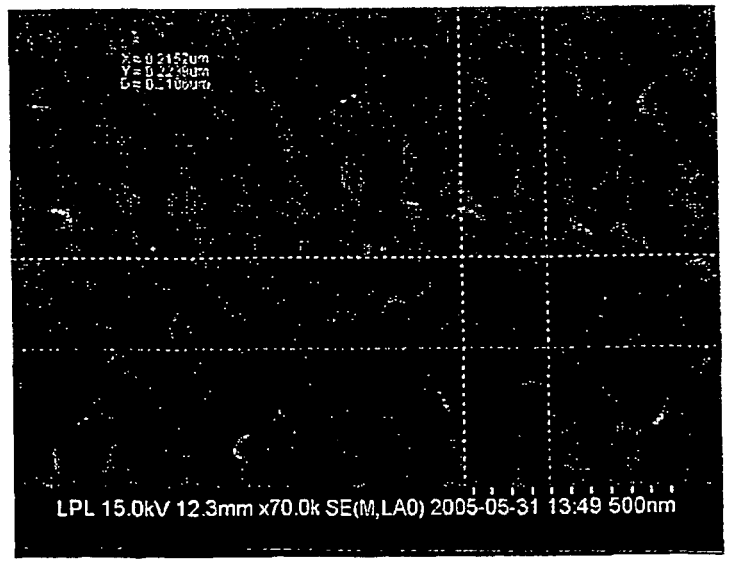
Figure 3A:
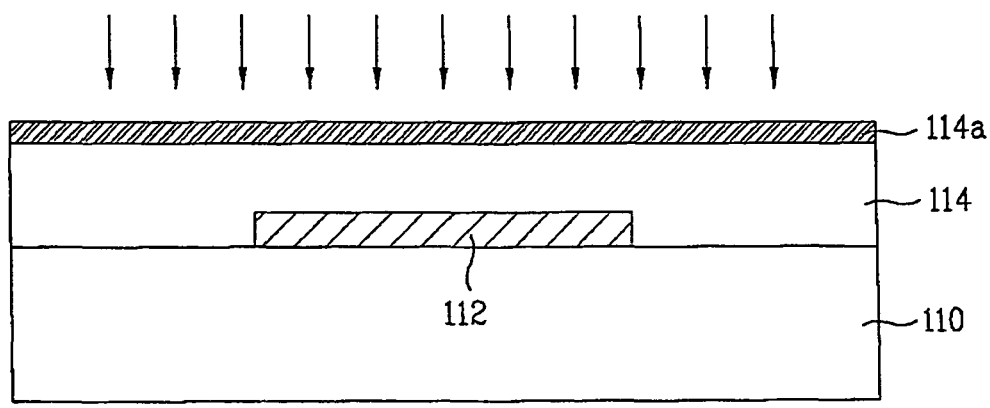
FIGS. 3A to 3D are cross section views illustrating a method for manufacturing an organic thin film transistor.
Figure 3B:
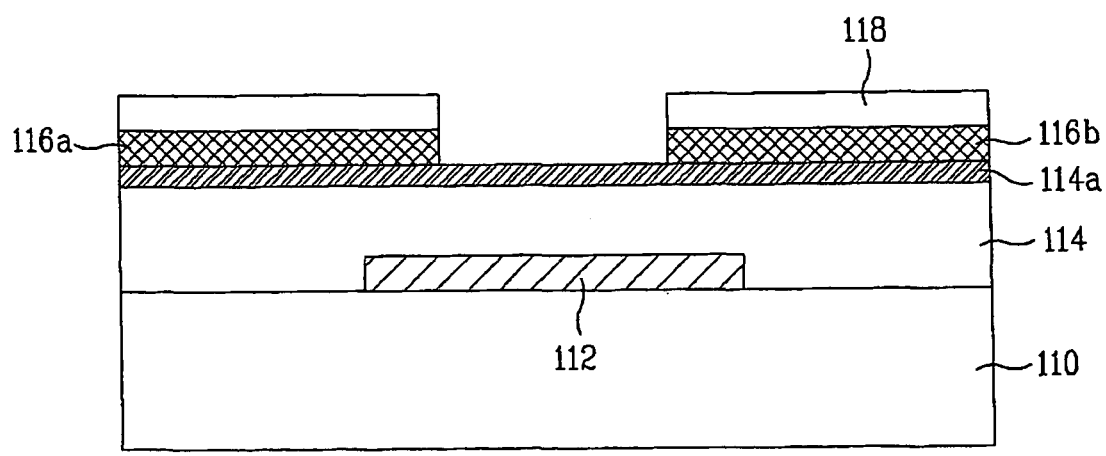
Figure 3C:
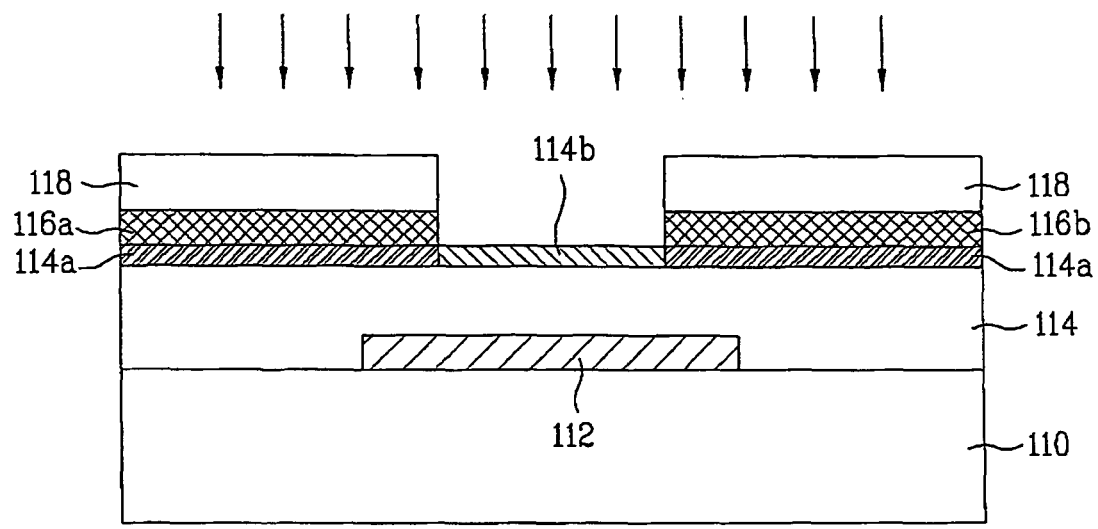
Figure 3D:
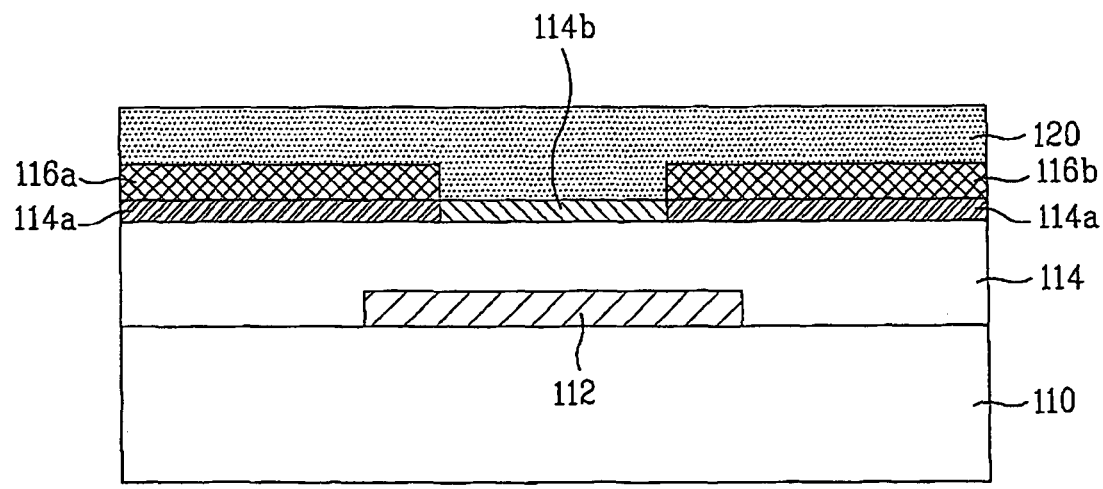

As show in FIG. 3D, the organic thin film transistor includes a gate electrode 112 of a metal material formed overlying a substrate 110; a gate insulation layer 114 of an organic insulation material formed overlying an entire surface of the substrate 110 including the gate electrode 112; source and drain electrodes 116a and 116b of a metal material formed overlying the gate insulation layer 114 and overlapped with both edges of the gate electrode 112; an organic semiconductor layer 120 formed overlying the gate insulation layer 114 including the source and drain electrodes 116a and 116b and formed of liquid crystalline polyfluorene block copolymer (LCPBC), pentacene or polythiophene; a hydrophilic adhesive layer 114a formed in a contact area between the gate insulation layer 114 and the source/drain electrodes 116a/116b; and a hydrophobic adhesive layer 114b formed in a channel region which corresponds to a contact area between the organic semiconductor layer 120 and the gate insulation layer 114.

The hydrophilic adhesive layer 114a is formed in the contact area between the gate insulation layer 114 and the source/drain electrodes 116a/116b, to thereby improve the adhesive properties therein. Also, the organic semiconductor layer 120 is formed overlying the gate insulation layer 114 including the hydrophobic adhesive layer 114b. A grain size of the organic semiconductor layer increases, and a grain boundary which functions as a charge trap site decreases, thereby improving the electric properties of the organic semiconductor layer.

A method for manufacturing the organic thin film transistor will be explained as follows.

First, as shown in FIG. 3A, a metal material is deposited overlying the substrate 110 of glass or transparent plastic, and is then patterned by photolithography, thereby forming the gate electrode 112. The gate electrode 112 may any one of low-resistance metal materials, for example, chromium (Cr), copper (Cu), molybdenum (Mo), aluminum (Al), aluminum alloy (Al alloy), tungsten (W), or may comprise an alloy thereof.

Thereafter, an organic insulation material is coated onto an entire surface of the substrate 100 including the gate electrode 112, thereby forming the gate insulation layer 114. The gate insulation layer 114 comprises an organic insulation material, for example, benzocyclobutene (BCB), acrylic-based material, or polyimide. Then, a first plasma treatment is performed on the gate insulation layer 114, whereby the hydrophilic adhesive layer 114a is formed in the surface of the gate insulation layer 114. The first plasma treatment may use gas of $O_2$, $H_2$, He, $SF_6$ or $CF_4$, or may use a mixing gas thereof.

As shown in FIG. 3B, a metal layer is formed overlying the hydrophilic adhesive layer 114a, and a photoresist is coated onto the metal layer. After a photo mask having a predetermined pattern is positioned above the photoresist, it is irradiated with the light, and is exposed and developed, thereby patterning the photoresist 118. Thereafter, the metal layer is selectively etched by using the patterned photoresist as a mask, thereby forming the source and drain electrodes 116a and 116b. The source and drain electrodes 116a and 116b may comprise any one of low-resistance metal materials, for example, chromium (Cr), copper (Cu), molybdenum (Mo), aluminum (Al), and aluminum alloy (Al alloy), or may comprise an alloy thereof.

The hydrophilic adhesive layer 114a formed by the first plasma treatment improves the adhesive strength between the gate insulation layer 114 of the organic material and the source/drain electrodes 116a/116b of the metal layer of the inorganic material.

As shown in FIG. 3C, a second plasma treatment is performed on the entire surface of the substrate 100 having the photoresist 118 on the source and drain electrodes 116a and 116b. Accordingly, the hydrophilic adhesive layer 114a exposed by the patterned photoresist 118 is changed to the hydrophobic adhesive layer 114b, and the hydrophilic adhesive layer 114a remains in the contact portion between the gate insulation layer 114 and the source/drain electrodes 116a/116b. The second plasma treatment uses gas mixture of $O_2$ and $CF_2$.

As shown in FIG. 3D, after removing the patterned photoresist 118, an organic material is deposited overlying the entire surface of the substrate 110 including the source and drain electrodes 116a and 116b, and is then patterned to thereby form the organic semiconductor layer 120. Thus, the organic thin film transistor is completed. The organic material for the organic semiconductor layer may comprise liquid crystalline polyfluorene block copolymer (LCPBC) pentacene, or polythiophene.

In forming the organic semiconductor layer 120 on the gate insulation layer 114 including the hydrophobic adhesive layer 114b, the grain size of the organic semiconductor layer increases, and the grain boundary which functions as the charge trap site decreases, thereby improving the electric properties of the organic semiconductor layer.

Figure 4:
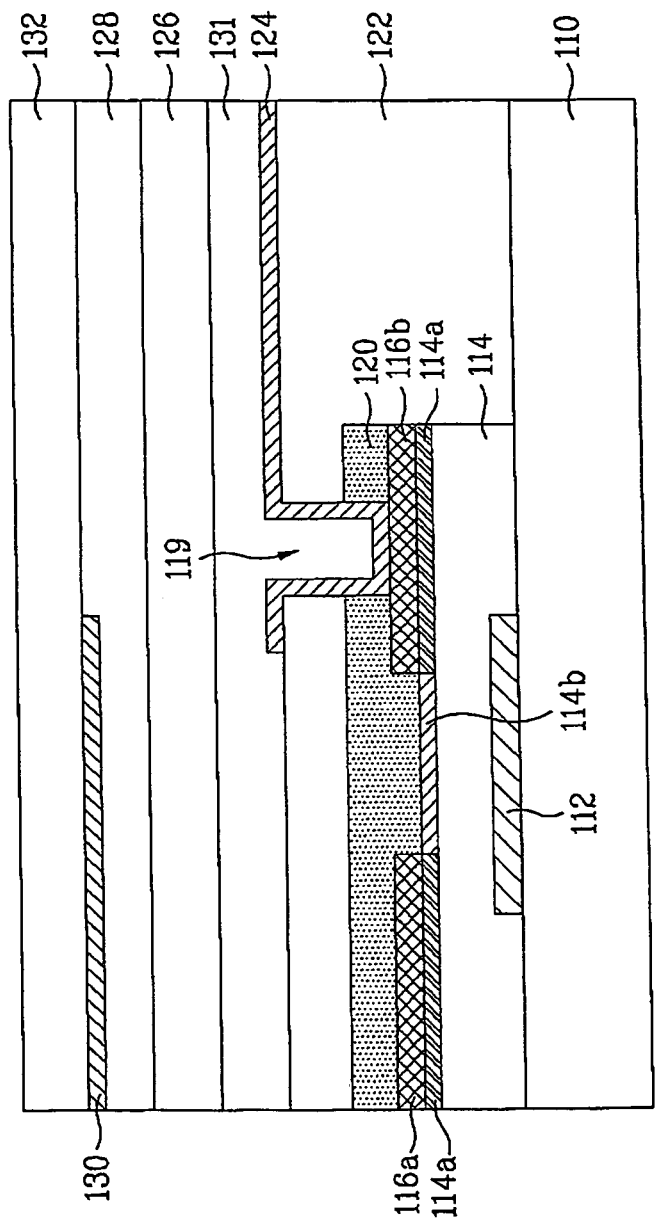
FIG. 4 is a cross section view illustrating an LCD device using an organic thin film transistor.

As shown in FIG. 4, an LCD device provided with the organic thin film transistor includes a passivation layer 122 and a pixel electrode 124. In this case, the passivation layer 122 is formed on the substrate 110 including the above-mentioned organic thin film transistor, wherein the passivation layer 122 comprises the organic insulation material of BCB, acrylic-based material or polyimide. Also, the pixel electrode 124 is connected with the drain electrode 116b through a contact hole 119. The pixel electrode 124 is formed in a pixel region of the passivation layer 122, wherein the pixel electrode 124 is formed of Indium Tin Oxide (ITO) or Indium Zinc Oxide (IZO).

In addition, an upper substrate 132 is provided adjacent the lower substrate 110, and is bonded to the lower substrate 110. The upper substrate 132 includes a black matrix 130 to prevent light from leaking into portions except the pixel region; a color filter layer 128 to represent colors; and a common electrode 126 to drive the pixel. The lower and upper substrates are bonded to each other with a predetermined space therebetween, and a liquid crystal layer 131 is formed in the predetermined space between the lower and upper substrates.

The organic thin film transistor is related with a bottom-gate structure. An organic thin film transistor is related with a top-gate structure.

Figure 5A:
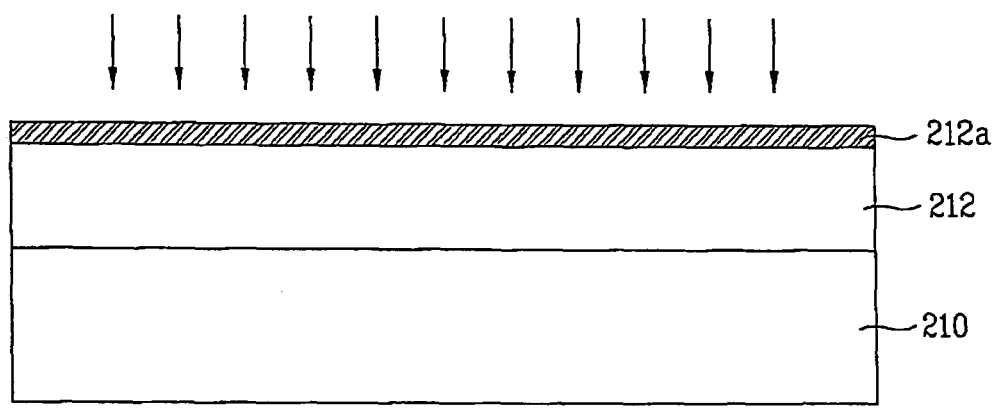
FIGS. 5A to 5D are cross section views illustrating a method for manufacturing an organic thin film transistor.
Figure 5B:
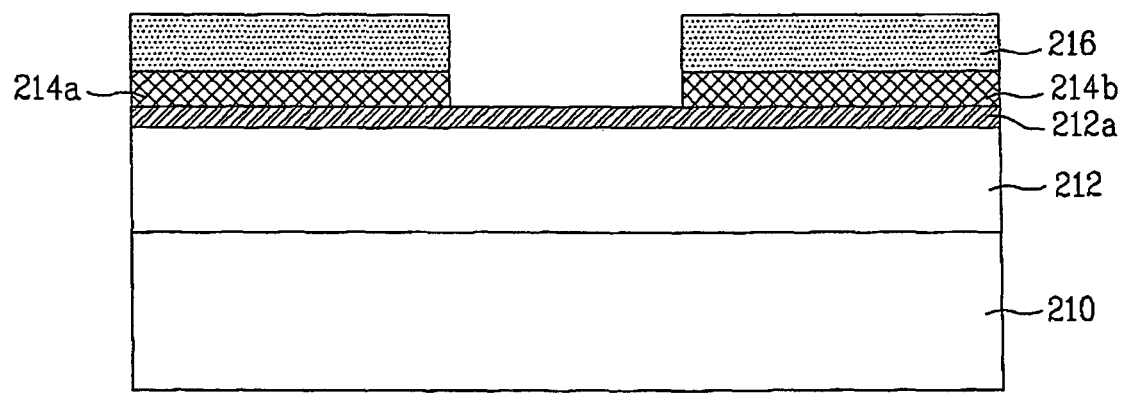
Figure 5C:
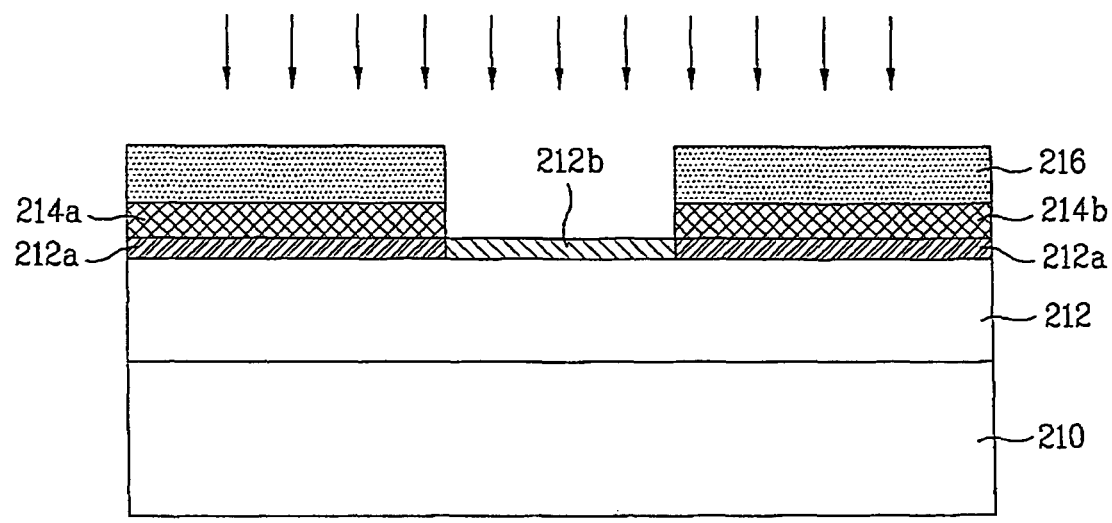

FIGS. 5A to 5D are cross section views illustrating a method for manufacturing an organic thin film transistor. FIG. 6 is a cross section view illustrating an LCD device using an organic thin film transistor.

Figure 5D:
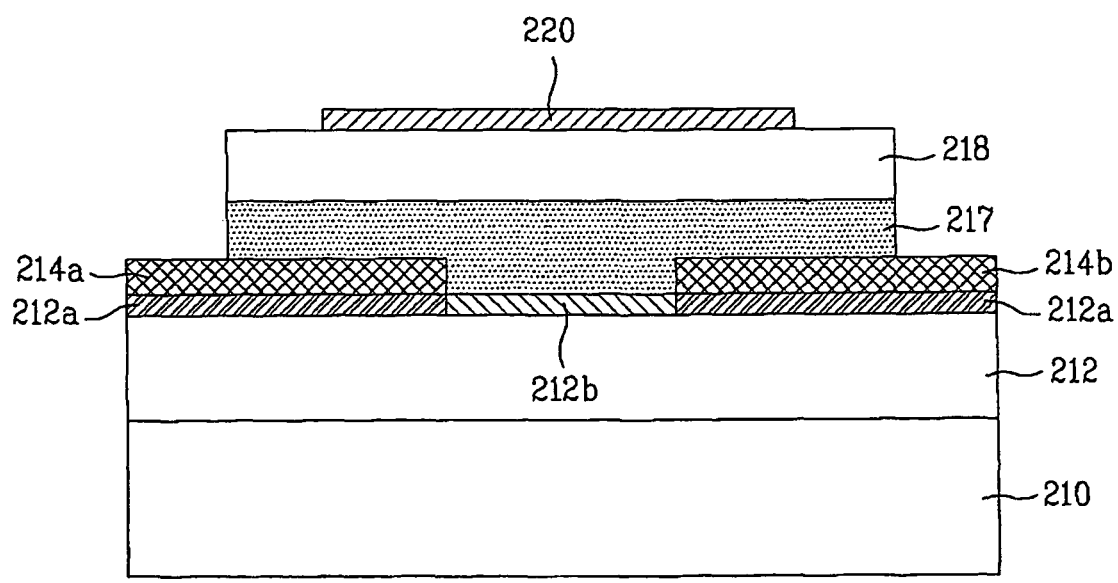
Figure 6:
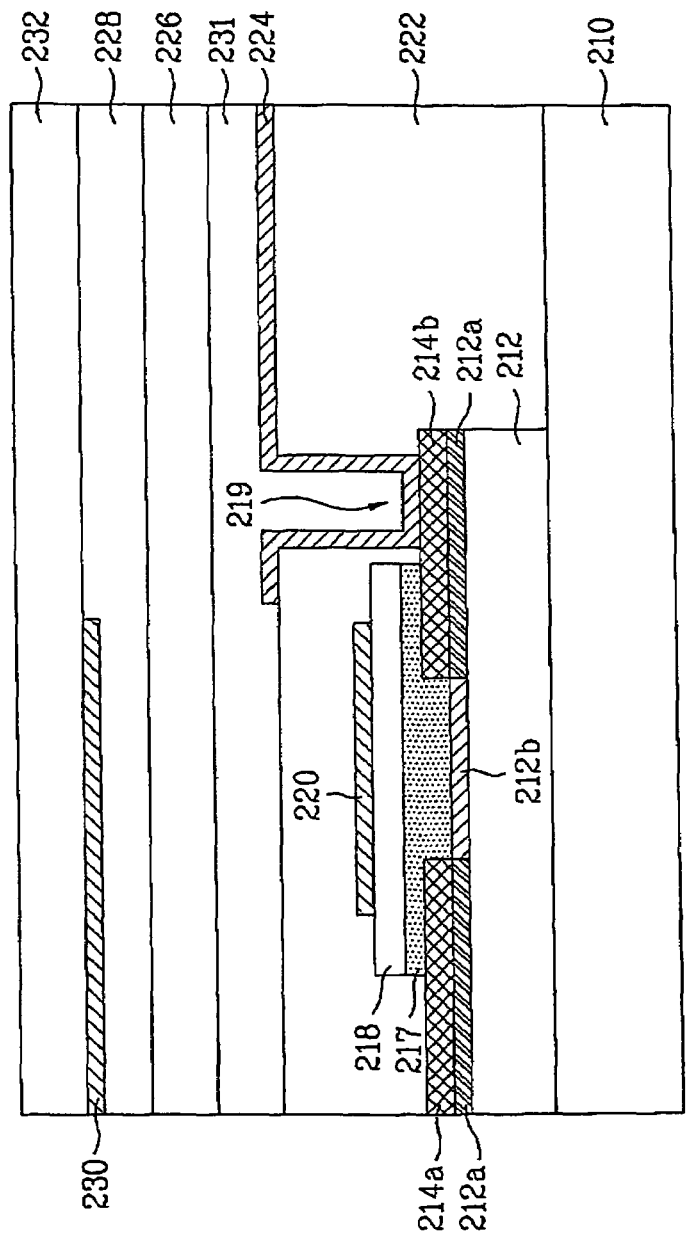
FIG. 6 is a cross section view illustrating an LCD device using an organic thin film transistor.

As shown in FIG. 5D, the organic thin film transistor includes a buffer layer 212 of an organic material formed overlying a lower substrate 210; island-shaped source/drain electrodes 214a/214b of a metal material formed overlying the buffer layer 212; an organic semiconductor layer 216 formed overlying the source/drain electrodes 214a/214b and the buffer layer 212 and formed of liquid crystalline polyfluorene block copolymer (LCPBC), pentacene or polythiophene; a gate insulation layer 218 formed overlying the organic semiconductor layer 216; a gate electrode 220 formed overlying the gate insulation layer 218 and overlapped with the source/drain electrodes 214a/214b; a hydrophilic adhesive layer 212a formed in a contact area between the buffer layer 212 and the source/drain electrodes 214a/214b; and a hydrophobic adhesive layer 212b formed in a channel region corresponding to a contact area between the buffer layer 212 and the organic semiconductor layer 216.

The hydrophilic adhesive layer 212a is formed in the contact area between the buffer layer 212 and the source/drain electrodes 214a/214b, to thereby improve the adhesive properties therein. Also, the organic semiconductor layer 216 is formed overlying the buffer layer 212 including the hydrophobic adhesive layer 212b. As a result, a grain size of the organic semiconductor layer increases, and a grain boundary which functions as a charge trap site decreases, thereby improving the electric properties of the organic semiconductor layer.

A method for manufacturing the organic thin film transistor will be explained as follows. First, as shown in FIG. 5A, the buffer layer 212 is formed overlying the substrate 210 of glass or transparent plastic. The buffer layer 212 is deposited to improve the crystal growth of the organic semiconductor layer. The buffer layer 212 may comprise an organic insulation material, for example, benzocyclobutene (BCB), acrylic-based material, or polyimide. Then, a first plasma treatment is performed on the buffer layer 212, whereby the hydrophilic adhesive layer 212a is formed in the surface of the buffer layer 212. The first plasma treatment may use any gas of $O_2$, $H_2$, He, $SF_6$ or $CF_4$, or may use a mixture thereof.

As shown in FIG. 5B, a metal layer is formed overlying the hydrophilic adhesive layer 114a, and a photoresist is coated onto the metal layer. Then, after a photo mask having a predetermined pattern is positioned above the photoresist, it is irradiated with the light, and is exposed and developed to thereby pattern the photoresist 216. Thereafter, the metal layer is selectively etched by using the patterned photoresist as a mask, thereby forming the source and drain electrodes 214a and 214b. The source and drain electrodes 214a and 214b may comprise any one of low-resistance metal materials, for example, chromium (Cr), copper (Cu), molybdenum (Mo), aluminum (Al), and aluminum alloy (Al alloy), or may be formed of an alloy thereof. The hydrophilic adhesive layer 212a formed by the first plasma treatment improves the adhesive strength between the buffer layer 212 of the organic material and the source/drain electrodes 214a/214b of the metal layer of the inorganic material.

Then, as shown in FIG. 5C, a second plasma treatment is performed on the entire surface of the substrate having the patterned photoresist. Thus, the hydrophilic adhesive layer 212a exposed by the patterned photoresist 216 is changed to the hydrophobic adhesive layer 212b, and the hydrophilic adhesive layer 212a is left in the contact portion between the buffer layer 212 and the source/drain electrodes 214a/214b. The second plasma treatment uses the gas mixture Of $O_2$ and $CF_2$.

As shown in FIG. 5D, after removing the patterned photoresist 216, an organic material is deposited overlying the entire surface of the substrate including the source and drain electrodes 214a and 214b, and is then patterned, thereby forming the organic semiconductor layer 217. The organic material for the organic semiconductor layer 217 may comprise liquid crystalline polyfluorene block copolymer (LCPBC) pentacene, or polythiophene. In forming the organic semiconductor layer 217 on the buffer layer 212 including the hydrophobic adhesive layer 212b, it is possible to increase the grain size of the organic semiconductor layer defined as the channel region, and to decrease the grain boundary which functions as the charge trap site, thereby improving the electric properties of the organic semiconductor layer.

Then, the gate insulation layer 218 is formed by depositing an inorganic insulation material overlying the organic semiconductor layer 217, or by coating an organic insulation material onto the organic semiconductor layer 217. The gate insulation layer 218 may comprise inorganic insulation material such as silicon oxide (SiOx) or silicon nitride (SiNx), or may comprise organic insulation material such as BCB, acrylic-based material, or polyimide. To obtain good adhesive strength between the gate insulation layer 218 and the organic semiconductor layer, it is preferable to form the gate insulation layer 218 of the organic insulation material.

Then, a metal material is deposited overlying the gate insulation layer 218, and is then patterned by photolithography, thereby forming the gate electrode 220 overlapped with the source and drain electrodes 214a and 214b. Thus, the organic thin film transistor is completed. The gate electrode 220 may comprise a metal material of chromium (Cr), copper (Cu), molybdenum (Mo), aluminum (Al), aluminum alloy (Al alloy), or tungsten (W), or may comprise an alloy thereof.

As shown in FIG. 6, an LCD device provided with the organic thin film transistor includes a passivation layer 222 and a pixel electrode 224. In this case, the passivation layer 222 is formed on the substrate 210 including the above-mentioned organic thin film transistor, wherein the passivation layer 222 comprises organic insulation material such as BCB, acrylic-based material, or polyimide. Also, the pixel electrode 224 is connected with the drain electrode 214b through a contact hole 219. The pixel electrode 224 is formed in a pixel region of the passivation layer 222, wherein the pixel electrode 224 is formed of ITO or IZO.

In addition, an upper substrate 232 is provided adjacent to the lower substrate 210, and is bonded to the lower substrate 210. The upper substrate 232 includes a black matrix 230 to prevent light from leaking into portions except the pixel region; a color filter layer 228 to represent colors; and a common electrode 226 to drive the pixel. The lower and upper substrates are bonded to each other with a predetermined space therebetween, and a liquid crystal layer 231 is formed in the predetermined space between the lower and upper substrates.

Figure 7A:
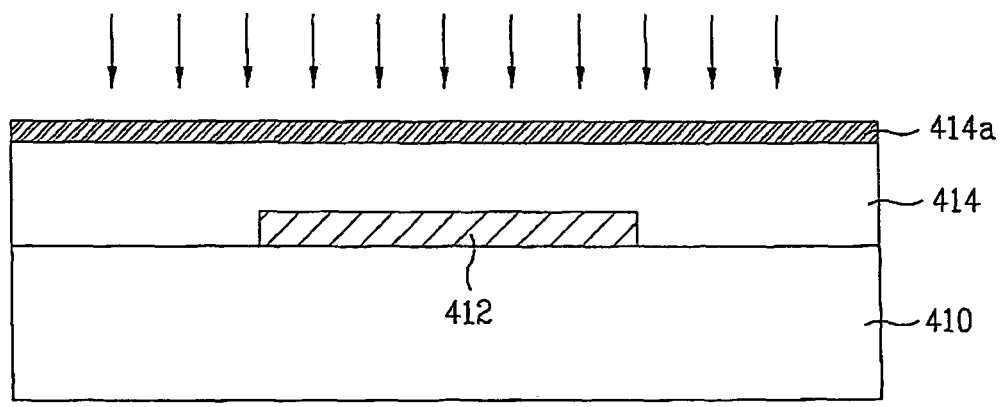
FIGS. 7A to 7D are cross section views illustrating a method for manufacturing an organic thin film transistor.
Figure 7B:
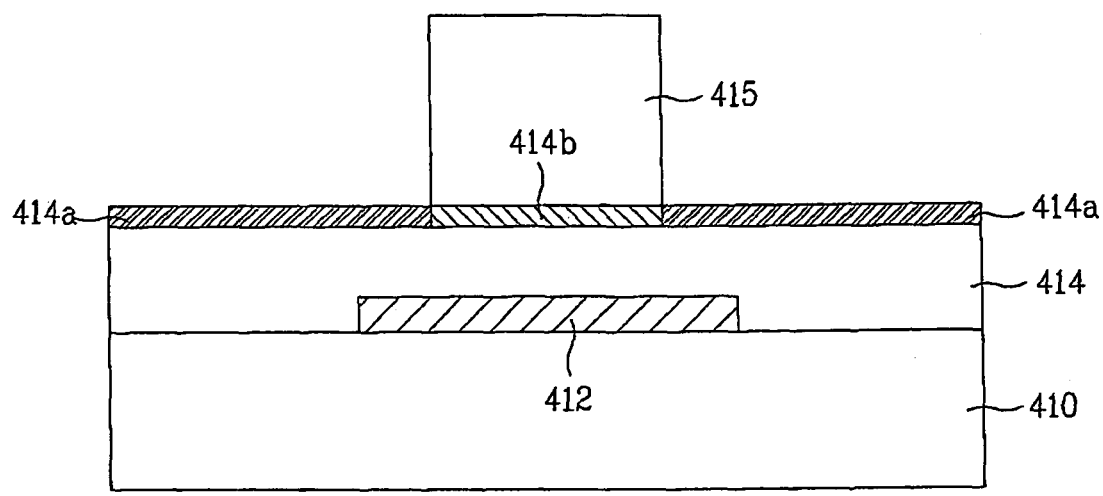
Figure 7C:
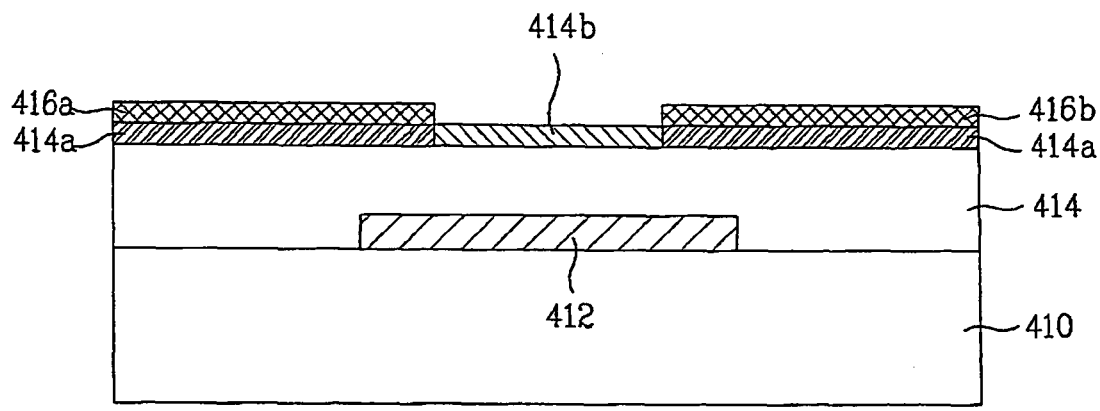

FIGS. 7A to 7D are cross section views illustrating a method for manufacturing an organic thin film transistor. FIG. 8 is a cross section view illustrating an LCD device using an organic thin film transistor.

Figure 7D:
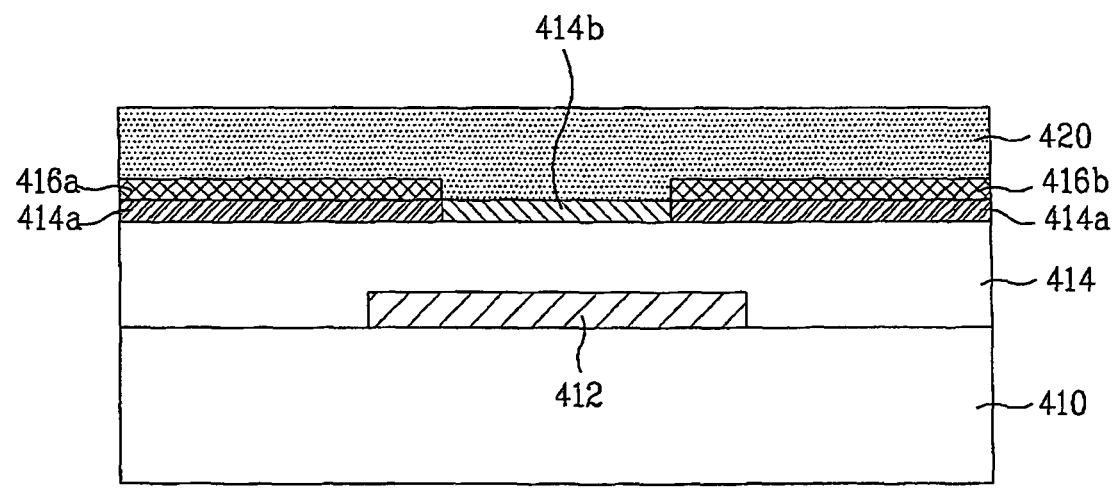
Figure 8:
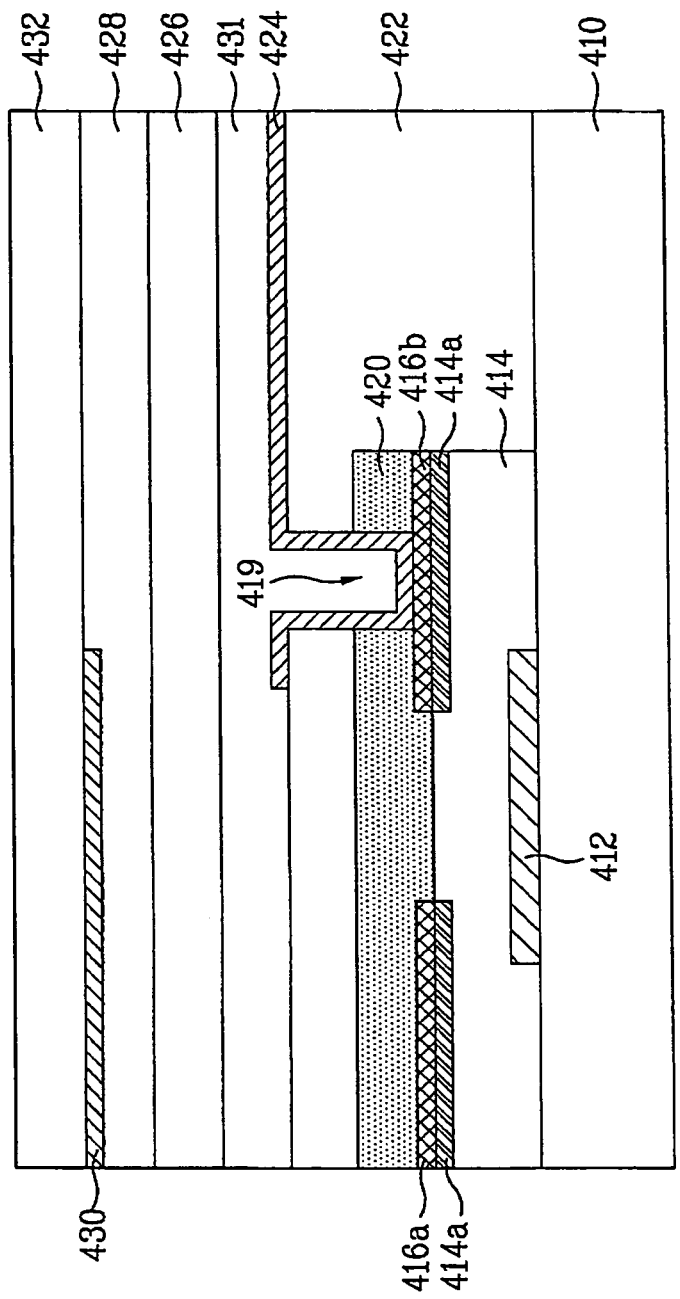
FIG. 8 is a cross section view illustrating an LCD device using an organic thin film transistor.

As shown in FIG. 7D, the organic thin film transistor includes a gate electrode 412 of a metal material formed overlying a substrate 410; a gate insulation layer 414 of an organic material formed overlying an entire surface of the substrate 410 including the gate electrode 412; source and drain electrodes 416a and 416b of a metal material formed overlying the gate insulation layer 414 and overlapped with both edges of the gate electrode 412; an organic semiconductor layer 420 formed overlying the gate insulation layer 414 including the source and drain electrodes 416a and 416b and formed of liquid crystalline polyfluorene block copolymer (LCPBC), pentacene or polythiophene; a hydrophilic adhesive layer 414a formed in a contact area between the gate insulation layer 414 and the source/drain electrodes 416a/416b; and a hydrophobic adhesive layer 414b formed in a contact area between the organic semiconductor layer 420 and the gate insulation layer 414.

The hydrophilic adhesive layer 414a is formed in the contact area between the gate insulation layer 414 and the source/drain electrodes 416a/416b, to thereby improve the adhesive properties therein. Also, the organic semiconductor layer 420 is formed overlying the gate insulation layer 414 including the hydrophobic adhesive layer 414b. As a result, a grain size of the organic semiconductor layer increases, and a grain boundary which functions as a charge trap site decreases, thereby improving the electric properties of the organic semiconductor layer.

A method for manufacturing the organic thin film transistor will be explained as follows. First, as shown in FIG. 7A, a metal material is deposited overlying the substrate 410 of glass or transparent plastic, and is then patterned by photolithography, thereby forming the gate electrode 412. The gate electrode 412 may comprise any one of low-resistance metal materials, for example, chromium (Cr), copper (Cu), molybdenum (Mo), aluminum (Al), aluminum alloy (Al alloy), tungsten (W), or may comprise an alloy thereof. Then, an organic insulation material is formed overlying an entire surface of the substrate 400 including the gate electrode 412, thereby forming the gate insulation layer 414. The gate insulation layer 414 comprises an organic insulation material, for example, benzocyclobutene (BCB), acrylic-based material, or polyimide. Then, a first plasma treatment is performed on the gate insulation layer 414, whereby the hydrophilic adhesive layer 414a is formed in the surface of the gate insulation layer 414. The first plasma treatment may use any gas of $O_2$, $H_2$, He, $SF_6$ or $CF_4$, or may use a gas mixture thereof.

As shown in FIG. 7B, a mold 415 is in contact with a predetermined portion of the hydrophilic adhesive layer 414a, whereby the contact portion is changed to the hydrophobic adhesive layer 414b. In this case, the mold 415 may comprise a thermal-curing material including poly-dimethyl siloxane (PDMS) by an additional step. Pressure is applied so that that the mold 415 including PDMS is in contact with the hydrophilic adhesive layer 414a. Thus, the contact portion between the mold 415 and the hydrophilic adhesive layer 414a is changed to the hydrophobic area by separating '—OH group' from the terminal group of the surface area. As a result, the hydrophilic adhesive layer 414a in contact with the mold 415 is changed to the hydrophobic adhesive layer 414b. Accordingly, the adhesive layer comprises the hydrophilic adhesive layer 414a and the hydrophobic adhesive layer 414b.

As shown in FIG. 7C, after removing the mold 415, a metal layer is formed overlying the gate insulation layer 414 including the hydrophilic adhesive layer 414a and the hydrophobic adhesive layer 414b. Then, the metal layer is coated with photoresist (not shown). Thereafter, a photo mask having a predetermined pattern is positioned above the photoresist, and is then irradiated with the light, and is exposed and developed, thereby patterning the photoresist. By using the patterned photoresist as a mask, the metal layer is selectively etched so that the source and drain electrodes 416a and 416b are formed on the hydrophilic adhesive layer 414a.

The source and drain electrodes 416a and 416b may comprise inorganic metal materials having low-resistance, for example, chromium (Cr), molybdenum (Mo), aluminum (Al), and aluminum alloy (Al alloy), or may comprise an alloy thereof. The hydrophilic adhesive layer 414a formed by the first plasma treatment improves the adhesive strength between the gate insulation layer 414 of the organic material and the source/drain electrodes 416a/416b.

As shown in FIG. 7D, an organic material is coated onto the entire surface of the gate insulation layer 414 including the source/drain electrodes 416a/416b and the hydrophobic adhesive layer 414b, and is then patterned to form the organic semiconductor layer 420, whereby the organic thin film transistor is completed. The organic material for the organic semiconductor layer may comprise liquid crystalline polyfluorene block copolymer (LCPBC) pentacene, or polythiophene.

In this case, the organic semiconductor layer 420 is formed overlying the gate insulation layer 414 including the hydrophobic adhesive layer 414b formed by the contact with the mold 415. As a result, a grain size of the organic semiconductor layer increases, and a grain boundary which functions as a charge trap site decreases, thereby improving the electric properties of the organic semiconductor layer.

As shown in FIG. 8, an LCD device provided with the organic thin film transistor includes a passivation layer 422 and a pixel electrode 424. In this case, the passivation layer 422 is formed overlying the substrate 410 including the above-mentioned organic thin film transistor, wherein the passivation layer 422 comprises organic insulation material such as BCB, acrylic-based material, or polyimide. Also, the pixel electrode 424 is connected with the drain electrode 416b through a contact hole 419. The pixel electrode 424 is formed in a pixel region of the passivation layer 422, wherein the pixel electrode 424 is formed of ITO or IZO.

In addition, an upper substrate 432 is provided adjacent to the lower substrate 410, and is bonded to the lower substrate 410. The upper substrate 432 includes a black matrix 430 to prevent light from leaking into portions except the pixel region; a color filter layer 428 to represent colors; and a common electrode 426 to drive the pixel. The lower and upper substrates are bonded to each other with a predetermined space therebetween, and a liquid crystal layer 431 is formed in the predetermined space between the lower and upper substrates.

The organic thin film transistor is related with a bottom-gate structure. An organic thin film transistor is related with a top-gate structure.

Figure 9A:
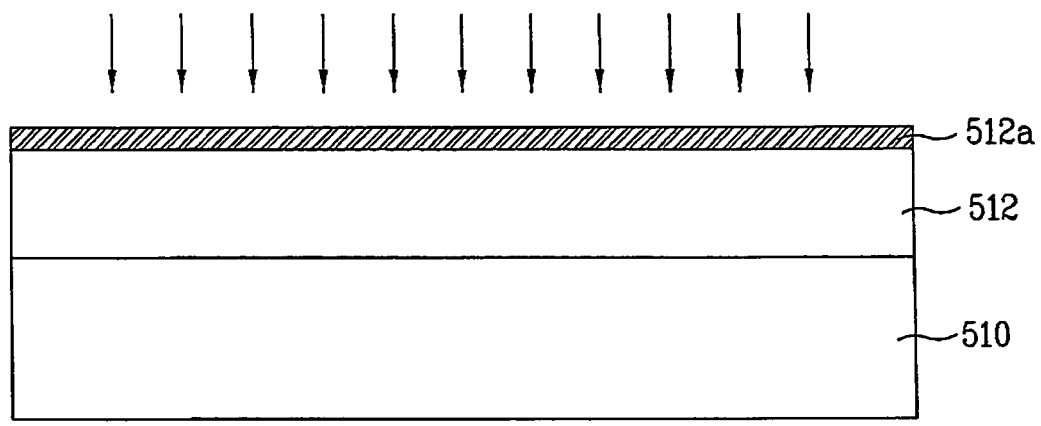
FIGS. 9A to 9D are cross section views illustrating a method for manufacturing an organic thin film transistor.
Figure 9B:
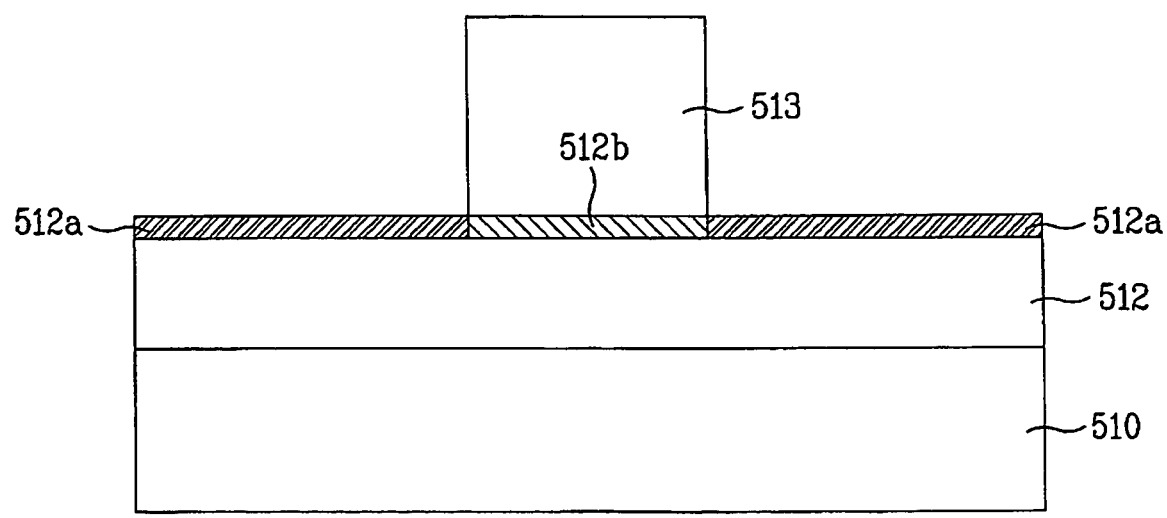
Figure 9C:
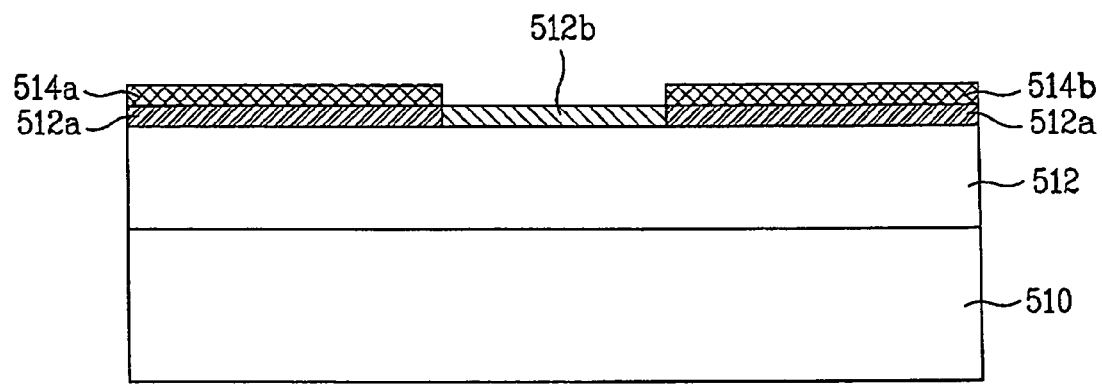

FIGS. 9A to 9D are cross section views illustrating a method for manufacturing an organic thin film transistor. FIG. 10 is a cross section view illustrating an LCD device using an organic thin film transistor.

Figure 9D:
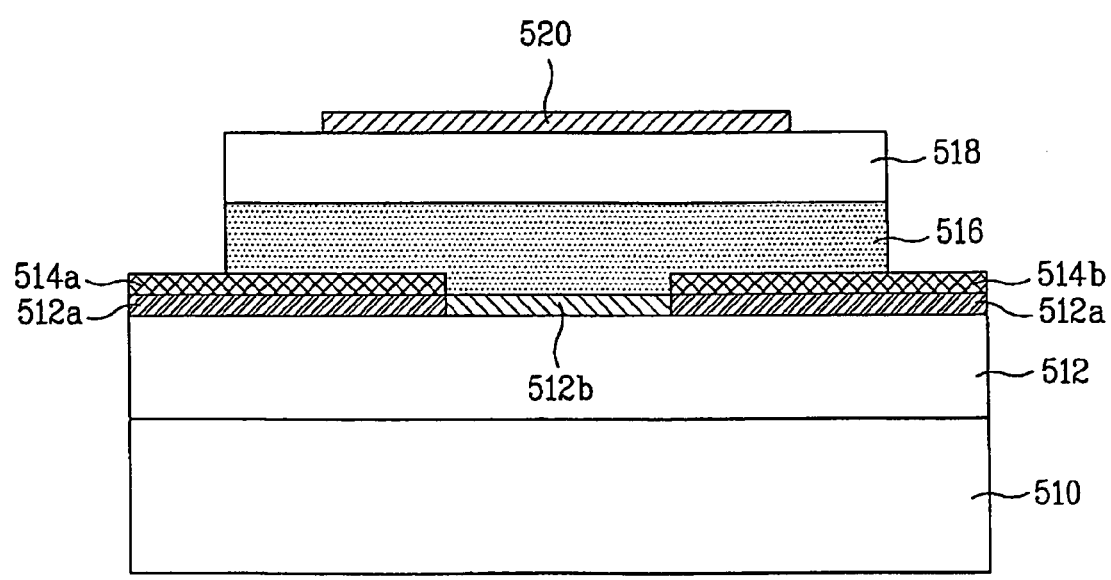
Figure 10:
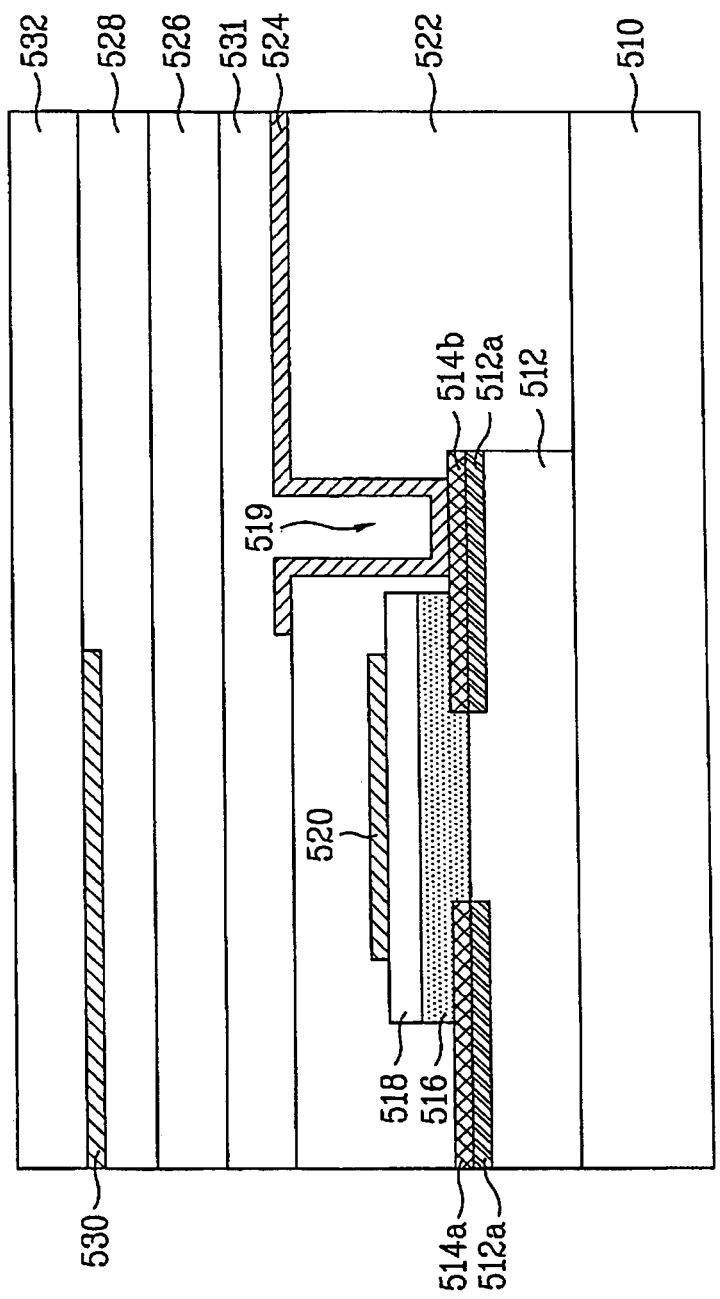
FIG. 10 is a cross section view illustrating an LCD device using an organic thin film transistor.

As shown in FIG. 9D, an organic thin film transistor includes a buffer layer 512 of an organic material formed overlying a lower substrate 510; island-shaped source/drain electrodes 514a/514b of a metal material formed overlying the buffer layer 512; an organic semiconductor layer 516 formed overlying the source/drain electrodes 514a/514b and the buffer layer 512 and formed of liquid crystalline polyfluorene block copolymer (LCPBC), pentacene, or polythiophene; a gate insulation layer 518 formed overlying the organic semiconductor layer 516; a gate electrode 520 formed overlying the gate insulation layer 518 and overlapped with the source/drain electrodes 514a/514b; a hydrophilic adhesive layer 512a formed in a contact area between the buffer layer 512 and the source/drain electrodes 514a/514b; and a hydrophobic adhesive layer 512b formed in a contact area between the buffer layer 512 and the organic semiconductor layer 516.

The hydrophilic adhesive layer 512a is formed in the contact area between the buffer layer 512 and the source/drain electrodes 514a/514b, to thereby improve the adhesive properties therein. Also, the organic semiconductor layer 516 is formed overlying the buffer layer 512 including the hydrophobic adhesive layer 512b. As a result, a grain size of the organic semiconductor layer increases, and a grain boundary which functions as a charge trap site decreases, thereby improving the electric properties of the organic semiconductor layer.

A method for manufacturing the organic thin film transistor will be explained as follows. First, as shown in FIG. 9A, the buffer layer 512 is formed overlying the substrate 510 of glass or transparent plastic. The buffer layer 512 is deposited to improve the crystal growth of the organic semiconductor layer. The buffer layer 512 may comprise an organic insulation material. For example, the buffer layer 512 comprises BCB, acrylic-based material, or polyimide. Then, a first plasma treatment is performed on the buffer layer 512, whereby the hydrophilic adhesive layer 512a is formed in the surface of the buffer layer 512. The first plasma treatment may use any gas of $O_2$, $H_2$, He, $SF_6$ or $CF_4$, or may use a gas mixture thereof.

As shown in FIG. 9B, a mold 513 is in contact with a predetermined portion of the hydrophilic adhesive layer 512a, whereby the contact portion is changed to the hydrophobic adhesive layer 512b. In this case, the mold 513 may comprise a thermal-curing material including poly-dimethyl siloxane (PDMS) by an additional step. Pressure is applied so that the mold 513 including PDMS is in contact with the hydrophilic adhesive layer 512a. Thus, the contact portion between the mold 513 and the hydrophilic adhesive layer 512a is changed to the hydrophobic area by separating an '—OH group' from the terminal group of the surface area. As a result, the hydrophilic adhesive layer 512a in contact with the mold 513 is changed to the hydrophobic adhesive layer 512b. Accordingly, the adhesive layer comprises the hydrophilic adhesive layer 512a and the hydrophobic adhesive layer 512b.

As shown in FIG. 9C, after removing the mold 513, a metal layer is formed overlying the buffer layer 512 including the hydrophilic adhesive layer 512a and the hydrophobic adhesive layer 512b. Then, the metal layer is coated with photoresist (not shown). Thereafter, a photo mask having a predetermined pattern is positioned above the photoresist, and is then irradiated with the light, and is exposed and developed, thereby patterning the photoresist. By using the patterned photoresist as a mask, the metal layer is selectively etched so that the source and drain electrodes 514a and 514b are formed on the hydrophilic adhesive layer 512a. Then, the patterned photoresist (not shown) is removed.

In this case, the source/drain electrodes may comprise inorganic metal materials having low-resistance, for example, chromium (Cr), molybdenum (Mo), aluminum (Al), and aluminum alloy (Al alloy), or may comprise an alloy thereof. The hydrophilic adhesive layer 512a formed by the first plasma treatment improves the adhesive strength between the buffer layer 512 of the organic material and the source/drain electrodes 514a/514b.

As shown in FIG. 9D, an organic material is coated onto the entire surface of the buffer layer 512 including the source/drain electrodes 514a/514b and the hydrophobic adhesive layer 512b, and is then patterned, thereby forming the organic semiconductor layer 516. The organic material for the organic semiconductor layer may comprise LCPBC pentacene, or polythiophene.

In this case, the organic semiconductor layer 516 is provided on the hydrophobic adhesive layer 512b formed by the contact with the mold 513. As a result, a grain size of the organic semiconductor layer increases, and a grain boundary which functions as a charge trap site decreases, thereby improving the electric properties of the organic semiconductor layer.

Then, the gate insulation layer 518 is formed overlying the organic semiconductor layer 516, wherein the gate insulation layer 518 may comprise the inorganic or organic insulation material. The gate insulation layer 518 may comprise inorganic insulation material such as silicon oxide (SiOx) or silicon nitride (SiNx), or may comprise organic insulation material such as BCB, acrylic-based material, or polyimide. To obtain good adhesive strength between the gate insulation layer 518 and the organic semiconductor layer, it is preferable to form the gate insulation layer 518 of organic insulation material.

Then, a metal material is deposited overlying the gate insulation layer 518, and is then patterned by photolithography, thereby forming the gate electrode 520 overlapped with the source/drain electrodes 514a/514b. Thus, the organic thin film transistor is completed.

The gate electrode 520 may be formed of a metal material of chromium (Cr), copper (Cu), molybdenum (Mo), aluminum (Al), aluminum alloy (Al alloy), or tungsten (W), or may comprise an alloy thereof.

As shown in FIG. 10, an LCD device provided with the organic thin film transistor includes a passivation layer 522 and a pixel electrode 524. In this case, the passivation layer 522 is formed overlying the substrate 510 including the above-mentioned organic thin film transistor, wherein the passivation layer 522 comprises organic insulation material such as BCB, acrylic-based material, or polyimide. Also, the pixel electrode 524 is connected with the drain electrode 514b through a contact hole 519. The pixel electrode 524 is formed in a pixel region of the passivation layer 522, wherein the pixel electrode 524 is formed of ITO or IZO.

In addition, an upper substrate 532 is provided adjacent the lower substrate 510, and is bonded to the lower substrate 510. The upper substrate 532 includes a black matrix 530 to prevent light from leaking into portions except the pixel region; a color filter layer 528 to represent colors; and a common electrode 526 to drive the pixel. The lower and upper substrates are bonded to each other with a predetermined space therebetween, and a liquid crystal layer 531 is formed in the predetermined space between the lower and upper substrates.

In the organic thin film transistor and the method for manufacturing the same, the organic semiconductor layer is formed on the insulation layer of the organic material changed to the hydrophobic properties. As a result, the grain size of the organic semiconductor layer increases, and the grain boundary which functions as the charge trap site decreases, thereby improving the electric properties of the organic semiconductor layer.

For the organic thin film transistor, the hydrophilic adhesive layer formed by the plasma treatment improves the adhesive strength between the buffer layer of the organic material and the source/drain electrodes.

It will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents.

What is claimed is:

1. An organic thin film transistor comprising:
    a substrate;
    a gate electrode formed on the substrate;
    a gate insulation layer formed on the gate electrode;
    an adhesive layer formed on the gate insulation layer and including a first adhesive portion and a second adhesive portion, wherein the first and second adhesive portions are formed in the same plane and in direct contact with the gate insulation layer;
    a source electrode and a drain electrode formed on and in contact with the first adhesive portion; and
    a semiconductor layer formed on the source and drain electrodes and in contact with the second adhesive portion,
    wherein the gate insulation layer has an affinity for water weaker than that of the first adhesive portion and stronger than that of the second adhesive portion.

2. The organic thin film transistor of claim 1, wherein the source/drain electrodes are formed of an inorganic metal material.

3. The organic thin film transistor of claim 1, wherein the first and second adhesive portions and the gate insulation layer are originally parts of a single layer of an organic insulation material and exhibit different degrees of affinity for water due to different plasma treatment processes applied to the first and second adhesive portions and no plasma treatment to the gate insulation layer.

4. The organic thin film transistor of claim 3, wherein the organic insulation material is benzocyclobutene (BCB).

* * * * *